US012278197B2

(12) United States Patent
Nishiyama et al.

(10) Patent No.: US 12,278,197 B2
(45) Date of Patent: Apr. 15, 2025

(54) PACKAGE BOARD

(71) Applicant: Murata Manufacturing Co., Ltd., Nagaokakyo (JP)

(72) Inventors: Kenji Nishiyama, Nagaokakyo (JP); Koshi Himeda, Nagaokakyo (JP); Yoshimitsu Ushimi, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 445 days.

(21) Appl. No.: 17/718,725

(22) Filed: Apr. 12, 2022

(65) Prior Publication Data
US 2022/0336381 A1 Oct. 20, 2022

(30) Foreign Application Priority Data

Apr. 20, 2021 (JP) ................................. 2021-071311

(51) Int. Cl.
*H01L 23/64* (2006.01)
*H01L 23/498* (2006.01)
*H01L 49/02* (2006.01)

(52) U.S. Cl.
CPC ...... *H01L 23/645* (2013.01); *H01L 23/49822* (2013.01); *H01L 23/49838* (2013.01); *H01L 28/10* (2013.01); *H01L 28/40* (2013.01)

(58) Field of Classification Search
CPC ............. H01L 23/645; H01L 23/49822; H01L 23/49838; H01L 28/10; H01L 28/40; H01L 23/66; H01L 25/16; H01L 23/49827; H01L 25/18; H01L 2224/16225; H01L 2924/19105; H01L 23/642
See application file for complete search history.

(56) References Cited

U.S. PATENT DOCUMENTS

| | | | |
|---|---|---|---|
| 2009/0243780 A1* | 10/2009 | Inoue .................... | H01L 23/645 336/200 |
| 2011/0050334 A1 | 3/2011 | Pan et al. | |
| 2016/0099098 A1* | 4/2016 | Yamaguchi ............. | H01F 17/04 336/221 |
| 2018/0310408 A1 | 10/2018 | Hamada et al. | |
| 2020/0321323 A1 | 10/2020 | Himeda et al. | |
| 2022/0285072 A1* | 9/2022 | Furukawa ................ | H01F 3/10 |

FOREIGN PATENT DOCUMENTS

| | | | |
|---|---|---|---|
| JP | 2018182222 A | 11/2018 | |
| JP | 2020161645 | * 10/2020 | |
| JP | 2020161645 A | 10/2020 | |
| WO | 2019130746 A1 | 7/2019 | |
| WO | WO-2021029141 A1 * | 2/2021 | ............. H01F 17/04 |

* cited by examiner

Primary Examiner — Karen Kusumakar
(74) Attorney, Agent, or Firm — ArentFox Schiff LLP

(57) ABSTRACT

A package board that includes an inductor layer having: a first magnetic layer including first magnetic particles and a resin; an inductor wiring that functions as an inductor in the first magnetic layer; and a second magnetic layer on at least one surface of the first magnetic layer, including second magnetic particles that are higher in average flatness than the first magnetic particles and a resin, the second magnetic particles having a shape where the dimension in a direction along the main surface of the second magnetic layer is longer than the dimension in the thickness direction of the second magnetic layer.

16 Claims, 9 Drawing Sheets

PACKAGE BOARD

CROSS REFERENCE TO RELATED APPLICATIONS

The present application claims priority to Japanese Patent Application No. 2021-071311, filed Apr. 20, 2021, the entire contents of which are incorporated herein by reference.

BACKGROUND OF THE INVENTION

Field of the Invention

The present invention relates to a package board.

Description of the Related Art

U.S. Patent Publication No. 2011/0050334 discloses a semiconductor package including a package board that has an inductor or a capacitor embedded therein. A voltage control unit (hereinafter, referred to as a voltage regulator) including an active element such as a switching device is mounted on the package board. The voltage regulator operates integrally with the inductor or the capacitor.

The inductor is formed by a path connected by a via in the package board, a via in a circuit board, and an inductor coil attached to the back surface of the circuit board.

Japanese Patent Application Laid-Open No. 2018-182222 describes a printed wiring board and a switching regulator.

The printed wiring board includes a sheet-like core substrate containing a magnetic material, a coil provided in the core substrate, and an external circuit layer provided on at least one of first and second surfaces of the core substrate opposed to each other.

The core substrate is made of a composite material of a metal magnetic filler and a resin.

According to the technique described in U.S. Patent Publication No. 2011/0050334, the inductor and the capacitor are laid out on the same plane, and thus, with a shrinkage in IC size by finer wiring processing techniques for ICs, insufficient inductance can be obtained due to the size restriction.

In addition, while the parasitic component produced by the via in the circuit board is utilized to compensate for the shortage of inductance, the problem of failing to secure high inductance arises because no magnetic material is used as a material for the circuit board.

In addition, in the case where the coil (inductor) is provided in the core substrate as described in Japanese Patent Application Laid-Open No. 2018-182222, the radiation noise from the inductor has the problem of causing a malfunction. Then, an extra element may be required for noise removal.

SUMMARY OF THE INVENTION

Accordingly, an object of the present invention is to provide a package board capable of achieving a sufficient inductance and suppressing radiation noises from an inductor.

A package board according to the present invention includes an inductor layer including: a first magnetic layer including first magnetic particles and a resin; an inductor wiring that functions as an inductor in the first magnetic layer; and a second magnetic layer on at least one surface of the first magnetic layer, including second magnetic particles that are higher in average flatness than the first magnetic particles and a resin, the second magnetic particles having a shape where the dimension in a direction along the main surface of the second magnetic layer is longer than the dimension in the thickness direction of the second magnetic layer.

The present invention can provide a package board capable of achieving a sufficient inductance and suppressing radiation noises from an inductor.

DETAILED DESCRIPTION OF THE INVENTION

A package board according to the present invention will be described below.

However, the present invention is not to be considered limited to the following configurations, but can be applied with changes appropriately made without changing the scope of the present invention. It is to be noted that the present invention also encompasses combinations of two or more desirable configurations according to respective embodiments of the present invention as described below.

The package board according to the present invention includes an inductor layer including: a first magnetic layer containing first magnetic particles and a resin; an inductor wiring that functions as an inductor in the first magnetic layer; and a second magnetic layer on at least one surface of the first magnetic layer, including second magnetic particles that are higher in average flatness than the first magnetic particles and a resin.

The second magnetic particles have a shape that is longer in dimension in the direction along the main surface of the second magnetic layer than in the thickness direction of the second magnetic layer.

The formation of the inductor wiring in the package board can increase the area of the inductor, thus allowing a sufficient inductance to be obtained. In addition, a loss due to the degraded Q value of the inductor can be reduced.

In addition, the formation of the inductor wiring in the package board can achieve the reduction in the size of the composite component including the inductor.

In addition, providing the inductor wiring in the first magnetic layer containing the magnetic material can improve the Q value of the inductor to reduce the loss. Furthermore, providing the second magnetic layer containing the second magnetic particles with the large flatness can suppress the radiation noise from the inductor.

First Embodiment of Package Board

The package board according to the first embodiment includes a capacitor layer that has a capacitor formed therein, in addition to the inductor layer.

The second magnetic layer of the inductor layer is located between the first magnetic layer of the inductor layer and the capacitor layer.

In addition, the package board includes a through-hole conductor that penetrates the first magnetic layer and second magnetic layer of the inductor layer and the capacitor layer in the thickness direction.

Figure 1:
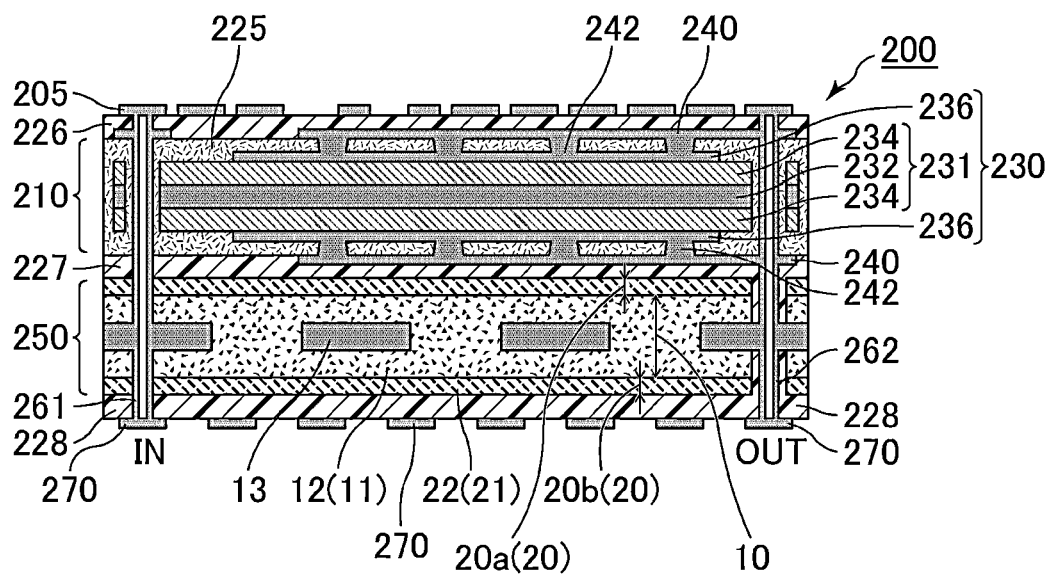
FIG. 1 is a sectional view schematically illustrating an example of a package board.

FIG. 1 is a sectional view schematically illustrating an example of the package board.

Figure 2:
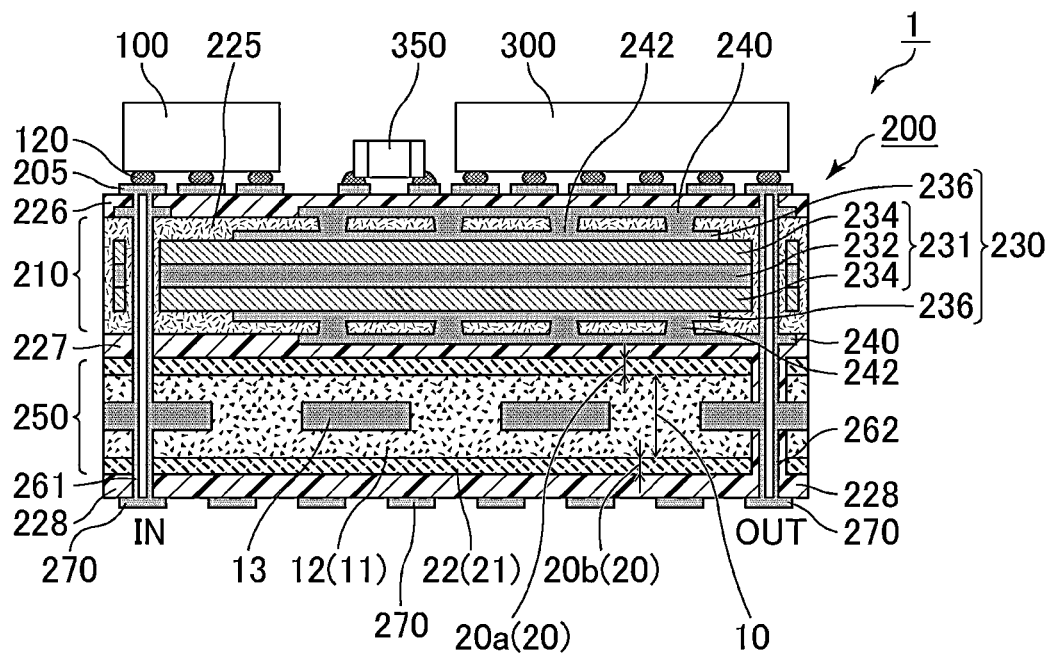
FIG. 2 is a sectional view schematically illustrating an example of a semiconductor composite device that has a voltage regulator and a load mounted on the package board illustrated in FIG. 1.

FIG. 2 is a sectional view schematically illustrating an example of a semiconductor composite device that has a voltage regulator and a load mounted on the package board illustrated in FIG. 1.

Figure 3:
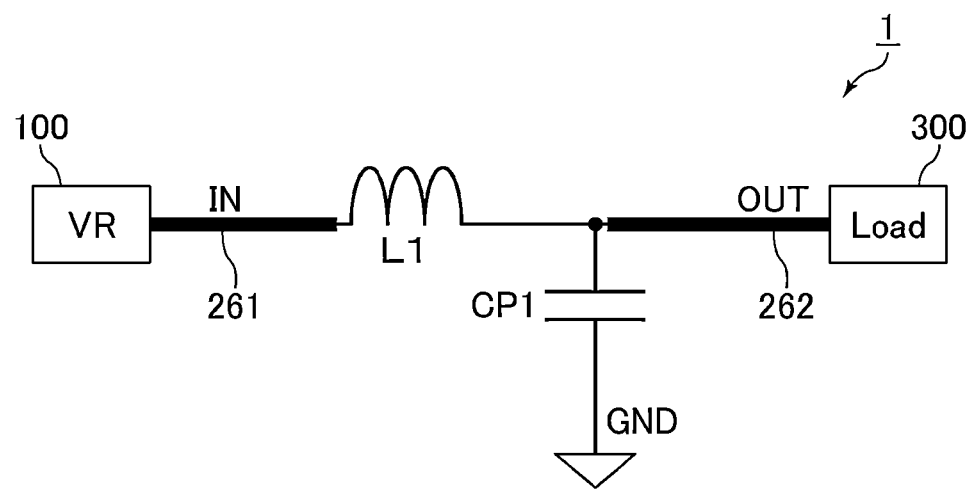
FIG. 3 is a block diagram illustrating an example of a circuit configuration of a semiconductor composite device.

FIG. 3 is a block diagram illustrating an example of the circuit configuration of the semiconductor composite device.

As illustrated in FIG. 1, the package board 200 includes a capacitor layer 210 with a capacitor formed and an inductor layer 250 with an inductor wiring provided.

The capacitor layer 210 has therein a capacitor CP1, and the inductor layer 250 has therein an inductor L1 (see FIG. 3 for the capacitor CP1 and the inductor L1).

A resin layer 227 is provided between the capacitor layer 210 and the inductor layer 250.

A resin layer 226 is provided as an insulating layer for insulating the exposed surface of the capacitor layer 210.

A resin layer 228 is provided as an insulating layer for insulating the exposed surface of the inductor layer 250.

In the semiconductor composite device 1 illustrated in FIG. 2, a voltage regulator (Voltage Regulator: VR) 100 and a load (Load) 300 are mounted on the package board 200. The load 300 is, for example, a semiconductor integrated circuit (Integrated Circuit: IC) such as a logical operation circuit or a memory circuit.

In addition, another electronic device 350 other than the voltage regulator 100 and the load 300 may be mounted on the mounting surface of the package board 200.

The voltage regulator 100 includes an active element (not illustrated) such as a semiconductor switching element, and controls the duty of the active element to adjust a direct-current voltage supplied from the outside to a voltage level that is suitable for the load 300.

The voltage regulator 100 and the load 300 are mounted on the surface of the package board 200, and the semiconductor composite device 1 is configured as one package component.

Chip components such as a decoupling capacitor, a choke inductor, a surge protection diode element, and a voltage-dividing resistance element may be mounted on the package board 200 as noise countermeasures. From the output of the voltage regulator to the input of the load, an inductor and a capacitor are disposed as a ripple filter, for example, for constituting a chopper-type step-down switching regulator.

The package board 200 has, as an upper surface, the surface with the load 300 mounted thereon, and has, on the upper surface, lands for mounting electronic components such as the load 300 and the voltage regulator 100, and an upper surface terminal layer 205 for electrically connecting the lands. The bottom surface, which is a surface opposite to the upper surface of the package board 200, has a bottom surface terminal layer 270 for mounting the semiconductor composite device 1 on a mother board. Wiring for further constituting a circuit may be formed in the bottom surface terminal layer 270.

In the semiconductor composite device 1 illustrated in FIG. 2, the inductor L1 is connected between the input terminal IN and output terminal OUT of the package board 200. The inductor L1 is connected to the voltage regulator 100 at the input terminal IN, and is connected to the load 300 at the output terminal OUT. The capacitor CP1 is connected between the output terminal OUT and a ground terminal GND (not illustrated in FIG. 2).

The voltage regulator 100, and the inductor L1 and capacitor CP1 in the package board 200 form a chopper-type step-down switching regulator. The inductor L1 and the capacitor CP1 function as a ripple filter for the step-down switching regulator.

For example, a direct-current voltage of 5 V input from the outside is stepped down to 1 V by the switching regulator, and supplied to the load 300.

The package board 200 includes through-hole conductors 261 and 262 obtained by metallizing through-holes that penetrates the package board 200. The package board has the through-hole conductors, thereby electrically connecting the respective elements in the thickness direction of the package board 200. As described above, the use of the through-hole conductors capable of leading the power supply wiring from the voltage regulator 100 via the ripple filter (the capacitor layer 210 and the inductor layer 250) to the load 300 in the direction perpendicular to the circuit surface without using any planar wiring configured on the upper surface terminal layer can reduce the impedance of the wiring and minimize the layout of the circuit surface, thus allowing the size of the semiconductor composite device to be reduced.

For understanding the description mentioned above, FIG. 3 illustrates, with the chopper-type step-down switching regulator as an example, the relationship between the circuit from the voltage regulator to the load and the configurations of the through-hole conductors. As illustrated in FIG. 3, the power supply wiring from the output of the voltage regulator (VR) 100 to the input of the load (Load) 300 is connected with the shortest and smallest area via the inductor L1. Such a configuration is particularly effective in a semiconductor composite device that has a thin board configuration such as a package board.

Next, details of the inductor layer constituting the package board will be described.

The inductor layer has an inductance component in a part of a board internal wiring that is one of the constituent elements of the package board.

The inductor layer includes: a first magnetic layer containing first magnetic particles and a resin; and a second magnetic layer provided on at least one surface of the first magnetic layer, including second magnetic particles that are higher in average flatness than the first magnetic particles and a resin.

An inductor wiring that functions as an inductor is provided in the first magnetic layer.

In addition, an external circuit layer provided on the surface of the second magnetic layer may be provided.

Figure 4:
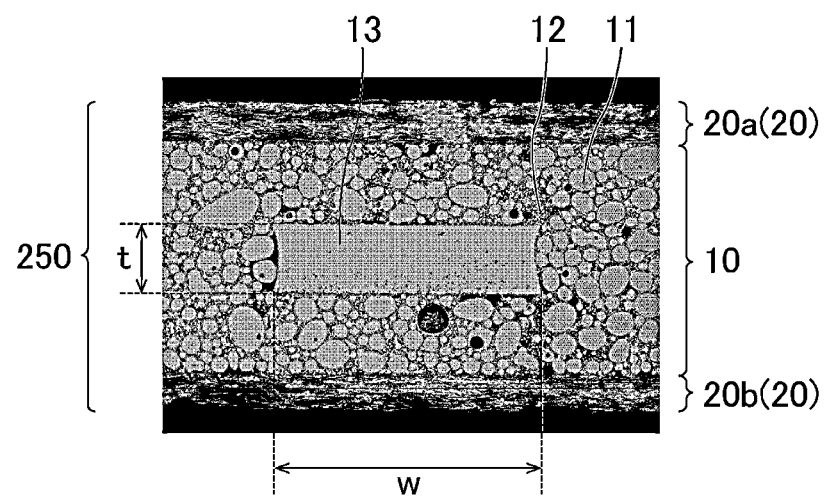
FIG. 4 is a sectional photograph showing an example of a layer configuration of an inductor layer.

FIG. 4 is a sectional photograph showing an example of the layer configuration of the inductor layer.

The inductor layer 250 shown in FIG. 4 includes a first magnetic layer 10 and second magnetic layers 20. The second magnetic layers 20 are provided on one and the other surfaces of the first magnetic layer 10. The second magnetic layer 20 provided on the upper surface of the first magnetic layer 10 is referred to as an upper surface-side second magnetic layer 20a, and the second magnetic layer 20 provided on the lower surface of the first magnetic layer 10 is referred to as a lower surface-side second magnetic layer 20b.

The first magnetic layer 10 includes first magnetic particles 11 and a resin 12. In addition, an inductor wiring 13 is provided in the first magnetic layer 10.

Sendust (Fe—Si—Al) ($\mu$=5 to 40: $\mu$ represents a magnetic permeability), Fe—Si—B ($\mu$=5 to 40), Fe—Si—Cr ($\mu$=5 to 35), silicon steel (Fe—Si) ($\mu$=5 to 30), iron (Fe) ($\mu$=5 to 25), or the like can be used as a material for the first magnetic particles 11.

The magnetic permeability presented above is a magnetic permeability including the influence of the shape of the first magnetic particles.

The magnetic permeability as a material for the first magnetic particles can be, for example, sendust ($\mu$=4000 to 12000), Fe—Si—B ($\mu$=500 to 4000), Fe—Si—Cr ($\mu$=300 to 4000), or Fe ($\mu$=100 to 5000).

The first magnetic particles are preferably spherical particles. When the first magnetic particles are spherical, the filling property is excellent, and the blending proportion of the magnetic particles can be increased.

Particles that have a flatness of 1/3 ($\approx$0.33) or less measured in accordance with the definition of flatness described later can be used as the spherical particles.

The filling ratio of the first magnetic particles in the first magnetic layer is preferably 50% or more. The filling ratio can be calculated as the proportion of the area occupied by the first magnetic particles in the first magnetic layer in the sectional photograph as shown in FIG. 4. In this calculation, the area occupied by the inductor wiring 13 is excluded from the area of the first magnetic layer.

Examples of the resin 12 constituting the first magnetic layer 10 include resins such as an epoxy, a phenol, or a polyimide.

As the inductor wiring 13, a metal wiring can be used, which is formed in such a manner that a copper core material (copper foil) formed on the order of 100 μm in thickness by an electroforming or rolling method is subjected to patterning into a coil shape with a photoresist or the like, and then etching.

The inductor wiring is a wiring that functions as an inductor.

When a plane along the main surface of the first magnetic layer is viewed from above (i.e., in a thickness direction), the inductor wiring is a single wiring where multiple straight lines that differ in current flowing direction are connected, and where the shape of the connection connecting the multiple straight lines is a straight line or a curved line, and the current flowing direction in one straight line differs from the current flowing direction in another straight line adjacent to the straight line.

Figure 5:
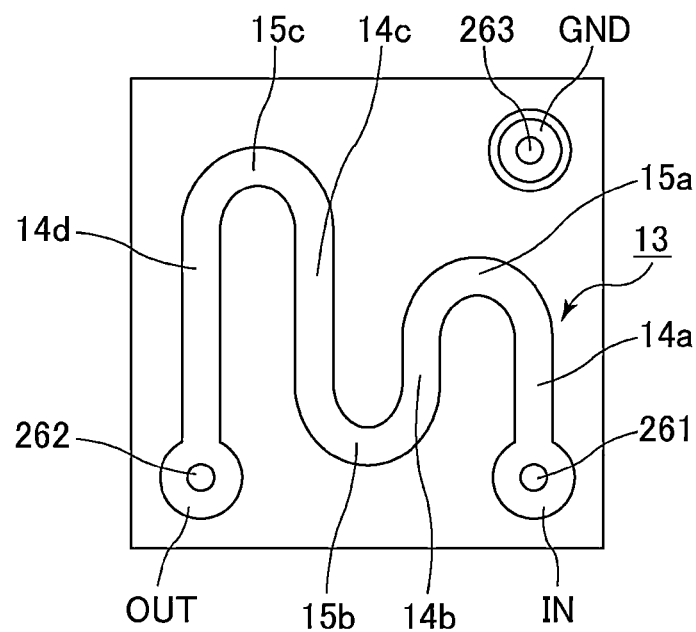
FIG. 5 is a plan view schematically illustrating a pattern of an inductor wiring.

FIG. 5 is a plan view schematically illustrating a pattern of the inductor wiring.

The inductor wiring 13 illustrated in FIG. 5 is a single wiring where a straight line 14a, a straight line 14b, a straight line 14c, and a straight line 14d as multiple straight lines that differ in current flowing direction are connected by a connection 15a, a connection 15b, and a connection 15c. The connection 15a, the connection 15b, and the connection 15c are all curved lines.

The current flowing direction is different between the straight line 14a and the straight line 14b, between the straight line 14b and the straight line 14c, and between the straight line 14c and the straight line 14d, respectively as adjacent straight lines.

In addition, one end (IN) of the inductor wiring 13 is electrically connected to the through-hole conductor 261, and the other end (OUT) thereof is electrically connected to the through-hole conductor 262.

FIG. 5 also illustrates a through-hole conductor 263 for use as a ground line (GND).

The inductor wiring in such a shape can acquire, with high area efficiency, an inductance that fails to be acquired by any linear wiring.

For causing the inductor wiring to function as an inductor, the inductor wiring is preferably not a wiring pattern where one and the other end thereof are connected by a straight line.

In the example mentioned above, the current flowing directions are exactly opposite to each other between the adjacent straight lines, but the present invention is not to be considered limited to the case where the directions are opposite to each other, as long as the current flowing directions are different from each other.

The fact that the current flowing direction is different between the adjacent straight lines means that the wiring is different from a wiring in a wound wiring shape, such as a helical shape, a spiral shape, or a spiral shape.

The inductor wiring of the example mentioned above can be also considered as a wiring in a non-wound wiring shape. When the wiring has a non-wound wiring shape, noises can be reduced.

The pattern of the inductor wiring may have the shape of a so-called meander wiring. In addition, the wiring may be a wiring composed of multiple straight lines and connections, where the number of the connections is two or more. The number of the connections is more preferably 3 or more, preferably 10 or less.

The wiring such as a helical shape or a spiral shape has difficulty in increasing the thickness of the wiring, but the wiring in the shape as in the example mentioned above allows an increase in wiring thickness, thus allowing a reduction in wiring resistance, and allowing a large current to flow.

The inductor wiring of the example mentioned above is a single-layer wiring. The single-layer wiring requires no via for connecting between layers in a multilayer wiring, thus allowing the thickness of the wiring to be increased and allowing the sectional area of the wiring to be increased.

In addition, the wiring is disposed without any overlap, the sites of heat generation are thus not concentrated, the heat dissipation is improved, and thus, also from this viewpoint, a large current is allowed to flow.

The thickness of the inductor wiring is preferably 100 μm or more for making the wiring suitable for allowing a large current to flow. In addition, from the viewpoint of reducing the thickness of the package board, the thickness is preferably 300 μm or less.

The width of the inductor wiring is preferably 50 μm or more. In addition, the wiring resistance can be reduced by increasing the width of the inductor wiring. In addition, a wiring can be achieved, which is suitable for allowing a large current to flow. In addition, the width of the inductor wiring is preferably 1000 μm or less.

In addition, in a plan view of the first magnetic layer including the inductor wiring as viewed from above (a plan view as shown in FIG. 5), the proportion of the area of the inductor wiring to the whole area of the first magnetic layer is preferably 20% or more, more preferably 40% or more.

When the proportion of the area of the inductor wiring is 20% or more, the inductance can be increased while keeping the wiring resistance low.

The inductor wiring preferably has an aspect ratio of 0.2 or more, represented by wiring thickness/wiring width.

The aspect ratio is a value represented by "length indicated by double-headed arrow t (wiring thickness)/length indicated by double-headed arrow w (wiring width)" in FIG. 4.

The aspect ratio of 0.2 or more allows a large current to flow, because of the large thickness of the wiring.

In addition, the aspect ratio is preferably 4 or less.

The second magnetic layer is provided on at least one surface of the first magnetic layer.

For the inductor layer 250 illustrated in FIG. 4, the second magnetic layer 20 is provided on one and the other surfaces of the first magnetic layer 10. The internal structure of such a second magnetic layer will be described with reference to FIG. 6.

Figure 6:
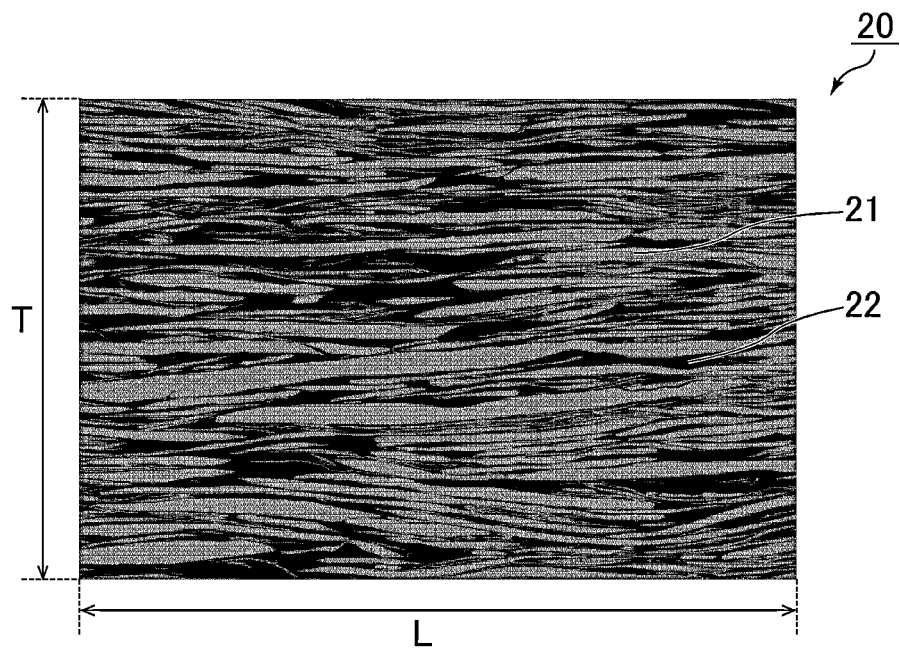
FIG. 6 is an enlarged sectional photograph showing an example of a second magnetic layer in an enlarged manner.

FIG. 6 is an enlarged sectional photograph showing an example of the second magnetic layer in an enlarged manner.

The second magnetic layer 20 includes second magnetic particles 21 and a resin 22.

Sendust (Fe—Si—Al) (μ=40 to 200), Fe—Si—B (μ=40 to 100), Fe—Si—Cr (μ=35 to 80), silicon steel (Fe—Si) (μ=35 to 60), or the like can be used as a material for the second magnetic particles 21.

The magnetic permeability presented above is a magnetic permeability including the influence of the shape of the second magnetic particles.

The magnetic permeability as a material for the second magnetic particles can be, for example, sendust (μ=4000 to 12000), Fe—Si—B (μ=500 to 4000), or Fe—Si—Cr (μ=300 to 4000). The second magnetic particles are particles that are higher in average flatness than the first magnetic particles.

Figure 7:
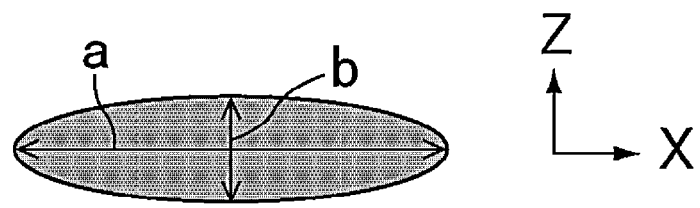
FIG. 7 is a sectional view schematically illustrating the flatness of a particle.

FIG. 7 is a sectional view schematically illustrating the flatness of a particle.

In the sectional shape of the particle, the direction corresponding to the smallest dimension of the particle is defined as a Z direction, and the direction corresponding to the longer dimension of the particle, among two directions orthogonal to the Z direction, is defined as an X direction. Further, the flatness f is expressed by $f=1-(b/a)$, where the dimension (diameter) in the X direction is referred to as a major axis a, and the dimension (diameter) in the Z direction is referred to as a minor axis b. If the shape of the particle is spherical (circular in cross section), the flatness is 0, and if the shape of the particle is a wholly crushed shape, the flatness is 1.

The first magnetic particles are preferably spherical particles, and thus close in flatness to 0. In contrast, the second magnetic particles are plate-like in sectional shape and high-flatness particles, and thus close in flatness to 1. Accordingly, the flatness of the second magnetic particles is higher than the flatness of the first magnetic particles.

The flatness of the first magnetic particles and the flatness of the second magnetic particles can be determined by measuring the dimensions of each particle in a sectional photograph as shown in FIGS. 4 and 6. The flatness of at least ten particles included in the sectional photograph can be measured, and defined as an average value thereof.

In addition, the second magnetic particles are particles in a shape where a dimension in a direction along the main surface of the second magnetic layer (a direction indicated by a double-headed arrow L in FIG. 6) is longer than a dimension in the thickness direction of the second magnetic layer (a direction indicated by a double-headed arrow T in FIG. 6). This means that the orientations of the second magnetic particles that are high in flatness have directions along the main surface of the second magnetic layer.

Among the dimensions of the second magnetic particles, the dimension in the direction along the main surface of the second magnetic layer (corresponding to the major axis a in FIG. 7) is preferably 50 μm to 1000 μm.

In addition, the dimension in the thickness direction of the second magnetic layer (corresponding to the minor axis b in FIG. 7) is preferably 0.5 μm to 50 μm.

In addition, the second magnetic particles are preferably 0.9 or more in flatness. The second magnetic particles may be less than 1 in flatness.

It is to be noted that the first magnetic particles are preferably ⅓ (≈0.33) or less in flatness. The first magnetic particles may be 0, or 0 or more in flatness.

Examples of the resin 22 constituting the second magnetic layer 20 include resins such as an epoxy, a phenol, and a polyimide. The type of the resin 22 constituting the second magnetic layer 20 may be the same as or different from the type of the resin 12 constituting the first magnetic layer 10.

The second magnetic particles are particles that are high in flatness, with anisotropy in magnetic permeability. The second magnetic particles are longer in dimension in the direction along the main surface of the second magnetic layer and smaller in dimension in the thickness direction of the second magnetic layer, and thus higher in magnetic permeability in the direction along the main surface of the second magnetic layer.

When the second magnetic layer with such characteristics is provided on at least one surface of the first magnetic layer, a leakage magnetic flux from the inductor provided in the first magnetic layer can be kept from leaking from the second magnetic layer. More specifically, the leakage magnetic flux from the inductor can be confined in the inductor layer.

Thus, the influence (decrease in inductance) of elements other than the inductor (active element, capacitor, leading wiring, and the like) on the inductance can be reduced, and the radiation noise from the inductor can be suppressed.

The second magnetic layer is preferably higher in magnetic permeability in the direction along the main surface of the second magnetic layer than in the thickness direction of the second magnetic layer.

In addition, the magnetic permeability in the direction along the main surface of the second magnetic layer is preferably five times or more as high as the magnetic permeability in the thickness direction of the second magnetic layer.

When the magnetic permeability in the direction along the main surface of the second magnetic layer is higher than the magnetic permeability in the thickness direction of the second magnetic layer, a leakage magnetic flux from the inductor can be confined in the inductor layer. When the magnetic permeability in the direction along the main surface of the second magnetic layer is five times or more as high as the magnetic permeability in the thickness direction of the second magnetic layer, such an advantageous effect is more effectively produced.

The magnetic permeability of the second magnetic layer in the direction along the main surface direction of the second magnetic layer is preferably higher than the magnetic permeability of the first magnetic layer in the direction along the main surface direction of the first magnetic layer.

In general, a material that is high in magnetic permeability has a poor filling property, and it is difficult to fill the thick inductor wiring with the material that is high in magnetic permeability. Thus, providing the first magnetic layer in which the wiring is filled with a material that is high in filling property but low in magnetic permeability, and laminating the second magnetic layer containing a material that is high in magnetic permeability, with a high magnetic permeability in the direction along the main surface direction, make it possible to achieve a balance between the filling property and high inductance for the thick inductor wiring, thereby suppressing the radiation noise from the inductor.

For more effectively producing such an effect, the magnetic permeability of the second magnetic layer in the direction along the main surface of the second magnetic layer is preferably 1.5 times or more as high as the magnetic permeability of the first magnetic layer in the direction along the main surface of the first magnetic layer.

For each of the second magnetic layer and the first magnetic layer, the magnetic permeability in the direction along the main surface direction and the magnetic permeability in the thickness direction can be measured by a network analyzer or the like.

Next, details of the capacitor layer constituting the package board will be described.

The capacitor layer 210 illustrated in FIG. 1 includes a capacitor part 230, a conductive part 240 electrically connected to the through-hole conductor 262 of the output terminal OUT, a conductive part electrically connected to the through-hole conductor (not illustrated in FIG. 1, illustrated as the through-hole conductor 263 in FIG. 5) of the ground terminal GND, and an insulating part 225 provided around these parts.

The second magnetic layer 20 of the inductor layer 250 is located between the first magnetic layer 10 of the inductor layer 250 and the capacitor layer 210.

As described above, the radiation noise from the inductor can be suppressed by the second magnetic layer, surface wave noise propagation due to magnetic coupling generated between the inductor and the capacitor can be thus suppressed, and the quality of the package board can be improved.

In addition, the influence of the capacitor on the inductance (decrease in inductance) can be reduced.

According to the present embodiment, the capacitor part 230 includes anode plate 231 made of a metal. For example, the anode plate 231 has a core part 232 made of a valve action metal. The anode plate 231 preferably has a porous part 234 provided on at least one main surface of the core part 232. On the surface of the porous part 234, a dielectric layer (not illustrated) is provided, and a cathode layer 236 is provided on the surface of the dielectric layer. Thus, according to the present embodiment, the capacitor part 230 forms an electrolytic capacitor.

In the case where the capacitor part 230 forms an electrolytic capacitor, the anode plate 231 is made of a valve action metal with a so-called valve action. Examples of the valve action metal include single metals such as aluminum, tantalum, niobium, titanium, and zirconium, or alloys containing at least one of these metals. Among these metals and alloys, aluminum or an aluminum alloy is preferred.

The anode plate 231 preferably has the form of a flat plate, more preferably the form of a foil. The anode plate 231 has only to have the porous part 234 on at least one main surface of the core part 232, and may have the porous part 234 on both main surfaces of the core part 232. The porous part 234 is preferably a porous layer formed on the surface of the core part 232, more preferably an etching layer.

The dielectric layer provided on the surface of the porous part 234 is porous with the surface condition of the porous part 234 reflected, and has a finely uneven surface profile. The dielectric layer is preferably made from an oxide film of the valve action metal mentioned above. For example, in the case where an aluminum foil is used as the anode plate 231, the surface of the aluminum foil can subjected to anodization (also referred to as a chemical conversion treatment) in an aqueous solution containing an ammonium adipate or the like, thereby forming a dielectric layer from an oxide film.

The cathode layer 236 provided on the surface of the dielectric layer includes, for example, a solid electrolyte layer provided on the surface of the dielectric layer. The cathode layer 236 preferably further includes a conductor layer provided on the surface of the solid electrolyte layer.

Examples of the material constituting the solid electrolyte layer include conductive polymers such as polypyrroles, polythiophenes, and polyanilines. Among these polymers, polythiophenes are preferred, and poly(3,4-ethylenedioxythiophene) referred to as a PEDOT is particularly preferred. In addition, the conductive polymers mentioned above may contain a dopant such as a polystyrene sulfonic acid (PSS). It is to be noted that the solid electrolyte layer preferably includes an inner layer that fills pores (recesses) of the dielectric layer and an outer layer that covers the dielectric layer.

The conductor layer includes at least one of a conductive resin layer and a metal layer. The conductor layer may be only the conductive resin layer or only the metal layer. The conductor layer preferably covers the whole surface of the solid electrolyte layer.

Examples of the conductive resin layer include a conductive adhesive layer containing at least one conductive filler selected from the group consisting of a silver filler, a copper filler, a nickel filler, and a carbon filler.

Examples of the metal layer include a metal plating film and a metal foil. The metal layer is preferably made of at least one metal selected from the group consisting of nickel, copper, silver, and alloys containing these metals as main constituents. The "main constituent" refers to an elemental constituent that has the highest ratio of element by weight.

The conductor layer includes, for example, a carbon layer provided on the surface of the solid electrolyte layer and a copper layer provided on the surface of the carbon layer.

The carbon layer is provided for electrically and mechanically connecting the solid electrolyte layer and the copper layer. The carbon layer can be formed in a predetermined region by applying a carbon paste onto the solid electrolyte layer by sponge transfer, screen printing, dispenser, inkjet printing, or the like.

The copper layer can be formed by printing with a copper paste on the carbon layer by sponge transfer, screen printing, spray application, dispenser, inkjet printing, or the like.

The conductive part 240 electrically connected to the through-hole conductor 262 of the output terminal OUT is made mainly of a low-resistance metal such as Ag, Au, or Cu. For the purpose of improving the adhesion force between the layers, a conductive adhesive material obtained by mixing the above-mentioned conductive filler and a resin may be provided as the conductive part.

In addition, the configuration of the conductive part electrically connected to the through-hole conductor of the ground terminal GND can be also similar to the configuration of the conductive part 240.

The insulating part 225 is made of an insulating material, e.g., a resin such as an epoxy, a phenol, or a polyimide, or a mixed material of a resin such as an epoxy, a phenol, or a polyimide and an inorganic filler such as silica or alumina.

In addition, as illustrated in FIG. 1, the cathode layer 236 as a cathode of the capacitor part 230 is electrically connected via the via conductor 242 to the conductive part 240 and the through-hole conductor 262.

Further, as the capacitor part 230, it is also possible to use a ceramic capacitor with a barium titanate used, or a thin film capacitor with a silicon nitride (SiN), a silicon dioxide ($SiO_2$), a hydrogen fluoride (HF), or the like used. From the viewpoints of: being capable of forming the capacitor part 230, which is thinner and relatively large in area; and mechanical properties such as the rigidity and flexibility of the package board 200, however, the capacitor part 230 is preferably a capacitor with a metal such as aluminum as a substrate, more preferably an electrolytic capacitor with a metal such as aluminum as a substrate.

The resin layers 226, 227, and 228 are used as joining materials for joining the respective layers to each other, and used as insulating layers for insulating the exposed surfaces of the capacitor layer 210 and inductor layer 250. The capacitor layer 210 and the inductor layer 250 are joined by the resin layer 227. On the surface of the capacitor layer 210, the resin layer 226 is formed, and the resin layer 228 is formed on the bottom surface of the inductor layer 250. The resin layers 226, 227, and 228 are formed from an insulating material, for example, a resin such as an epoxy, a polyimide, or a phenol, or a mixed material of a resin such as an epoxy, a polyimide, or a phenol and an inorganic filler such as silica or alumina. For ensuring the adhesion to the through-hole conductors, a material mainly composed of an epoxy resin is preferably used as the resin layers.

The upper surface terminal layer 205 including the lands for mounting devices such as the voltage regulator 100 and a wiring for connecting the lands is formed on the surface of the resin layer 226. The devices mounted on the package board 200 are electrically connected to the lands or terminals of the upper surface terminal layer 205 with solder bumps 120 interposed therebetween.

The upper surface terminal layer 205 is formed from a low-resistance metal material such as copper (Cu), gold (Au), or silver (Ag). It is to be noted that the upper surface terminal layer 205 is not limited to the case of being formed only on the surface of the resin layer 226, and may be formed over multiple layers in the resin layer 226, for example. It is to be noted that the surface of the land or terminal formed on the mounting surface of upper surface terminal layer 205 is preferably subjected to a surface treatment such as nickel/gold (Ni/Au) plating, nickel/lead/gold (Ni/Pb/Au) plating, or a pre-flux treatment for facilitating the device mounting. In addition, a solder resist layer may be formed on the outermost layer part of the upper surface terminal layer 205 for preventing a solder flow at the time of surface-mounting the devices.

The package board 200 includes the through-hole conductor 261 and the through-hole conductor 262 that penetrate the first magnetic layer 10 and the second magnetic layers 20 (upper surface-side second magnetic layer 20a and lower surface-side second magnetic layer 20b) in the thickness direction. The through-hole conductor 261 is connected to one end (IN) of the inductor wiring, and the through-hole conductor 262 is connected to the other end (OUT) of the inductor wiring.

In addition, the package board 200 includes the through-hole conductor 263 (see FIG. 5) that penetrates the first magnetic layer 10 and the second magnetic layers 20 (upper surface-side second magnetic layer 20a and lower surface-side second magnetic layer 20b) in the thickness direction for use as a ground line (GND).

The use of the through-hole conductors allows the impedance of the wiring to be reduced and allows the layout of the circuit surface to be minimized, thus allowing the size of the semiconductor composite device to be reduced.

The thickness of the whole package board is preferably 2.0 mm or less, more preferably 1.6 mm or less in consideration of the thickness reduction of the system, the heat dissipation of the logical operation circuit, and the like.

The thickness of the inductor layer is preferably 0.5 mm or less, more preferably 0.3 mm or less, because of the required thickness reduction of the package board. In the case of multiple inductor layers provided, the thickness of the inductor layer is determined as the sum of the thicknesses of the multiple inductor layers.

In addition, the thickness of the capacitor layer is preferably 1.2 mm or less, more preferably 0.8 mm or less, because of the required thickness reduction of the package board. In the case of multiple capacitor layers provided, the thickness of the capacitor layer is determined as the sum of the thicknesses of the multiple capacitor layers.

It is to be noted that while one layer for the inductor layer 250 and one layer for the capacitor layer 210 are provided in the package board 200 described above, multiple layers for the inductor layer 250 and the capacitor layer 210 may be provided for achieving desired inductance value and capacitance value.

In addition, the order of laminating the inductor layer 250 and the capacitor layer 210 from the mounting surface may be reversed. More specifically, the inductor layer 250 may be located on the side where the voltage regulator 100 and the load 300 are mounted.

Furthermore, the package board may have, for any purpose, a multilayer configuration such as inductor layer 250/capacitor layer 210/inductor layer 250 or a multilayer configuration such as capacitor layer 210/inductor layer 250/capacitor layer 210.

In the semiconductor composite device 1 illustrated in FIG. 2, the upper surface-side second magnetic layer 20a as the second magnetic layer 20 is located between the inductor wiring 13 and the voltage regulator 100 and load 300.

As described above, the radiation noise from the inductor can be suppressed by the second magnetic layer, surface wave noise propagation due to magnetic coupling generated between the inductor, and the active element constituting the voltage regulator and the element such as an IC as a load can be thus suppressed, and the quality of the package board can be improved.

In addition, the influence of the active element constituting the voltage regulator and the element such as an IC as a load on the inductance (decrease in inductance) can be reduced.

[Method for Manufacturing Package Board]

In the case of manufacturing the package board as illustrated in FIG. 1, the capacitor layer 210 and the inductor layer 250 are individually manufactured. Thereafter, the capacitor layer 210 and the inductor layer 250 are joined and then integrated with the use of the resin layers 226, 227, and 228. Next, through-hole conductors are formed in the integrated capacitor layer 210 and inductor layer 250. Thereafter, an electrode pattern and a wiring pattern to serve as the upper surface terminal layer 205 are formed on the mounting surface, thereby completing the package board 200.

Further, if necessary, an electrode pattern and a wiring pattern to serve as the bottom surface terminal layer 270 may be formed on the surface opposite to the mounting surface.

The semiconductor composite device 1 can be obtained by mounting devices such as the voltage regulator 100 on the completed package board 200.

The inductor layer constituting the package board can be prepared by the following process.

First, both surfaces of a Cu foil are subjected to patterning with a photoresist or the like, and the photoresist opening is etched, thereby forming an inductor wiring in a predetermined pattern.

Next, a magnetic sheet as the composite material of the first magnetic particles and resin is formed by vacuum lamination or vacuum pressing on the inductor wiring while filling the space between the patterns of the inductor wiring. Furthermore, planarization and thermal curing of the resin are performed with a hot press machine. Thus, the first magnetic layer including the inductor wiring is formed.

The magnetic sheet may be formed on each side of the inductor wiring.

Next, a magnetic sheet as the composite material of the second magnetic particles and resin is formed by vacuum lamination or vacuum pressing on the upper surface and lower surface of the first magnetic layer. Thus, the second magnetic layer is formed.

It is to be noted that the second magnetic layer may be formed only on one surface of the first magnetic layer.

Next, a resin layer (for example, an Ajinomoto Build-up Film (ABF) or the like) is formed on the surface of the second magnetic layer.

Then, as described above, the capacitor layer and the inductor layer are joined and then integrated with the resin layers interposed therebetween.

Next, through holes are formed by a drill, a laser, or the like in parts of the inductor wiring corresponding to the extended electrode.

Further, conductors are formed by plating the inside the through holes, and then connected as through hole conductors to the inductor wiring. The conductors formed in the through holes may be conformal or filling, but is preferably filling in the case of causing a large current to flow.

Furthermore, the package board is completed by forming the electrode pattern and the wiring pattern on the mounting surface.

Other Embodiments of Package Board and Semiconductor Composite Device

Hereinafter, some examples of other embodiments of the package board and semiconductor composite device will be described. Hereinafter, different matters from the first embodiment of the package board and semiconductor composite device described above and additional matters will be described.

Figure 8:
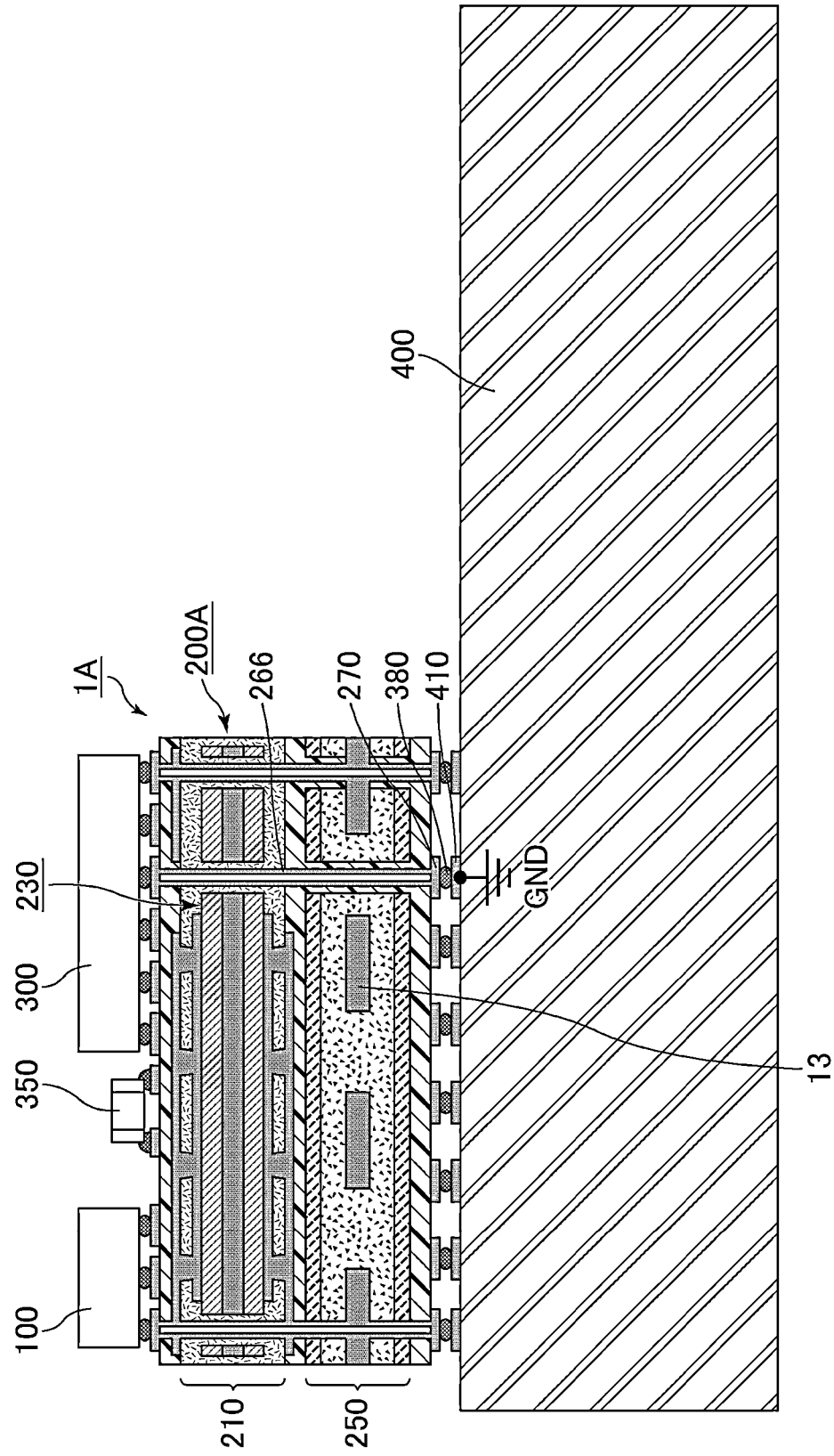
FIG. 8 is a sectional view schematically illustrating an example of a mode in which a semiconductor composite device is mounted on a mother board.

FIG. 8 is a sectional view schematically illustrating an example of a mode in which a semiconductor composite device is mounted on a mother board.

In a package board 200A included in the semiconductor composite device 1A illustrated in FIG. 8, a through-hole conductor 266 is provided, which is connected to a terminal of a signal ground line of a load 300 in the case where the load 300 is mounted on the package board 200A. The through-hole conductor 266 penetrates to the bottom surface terminal layer 270 without being electrically connected to the capacitor part 230 included in the capacitor layer 210 or the inductor wiring 13 included in the inductor layer 250. Further, the through-hole conductor 266 is electrically connected to a terminal 410 connected to a ground line of the mother board 400, with a solder bump 380 interposed therebetween.

It is to be noted that although the through-hole conductor of the ground line of the load 300 has been described with reference to FIG. 8, ground lines of other electronic devices may have the same configuration.

Figure 9:
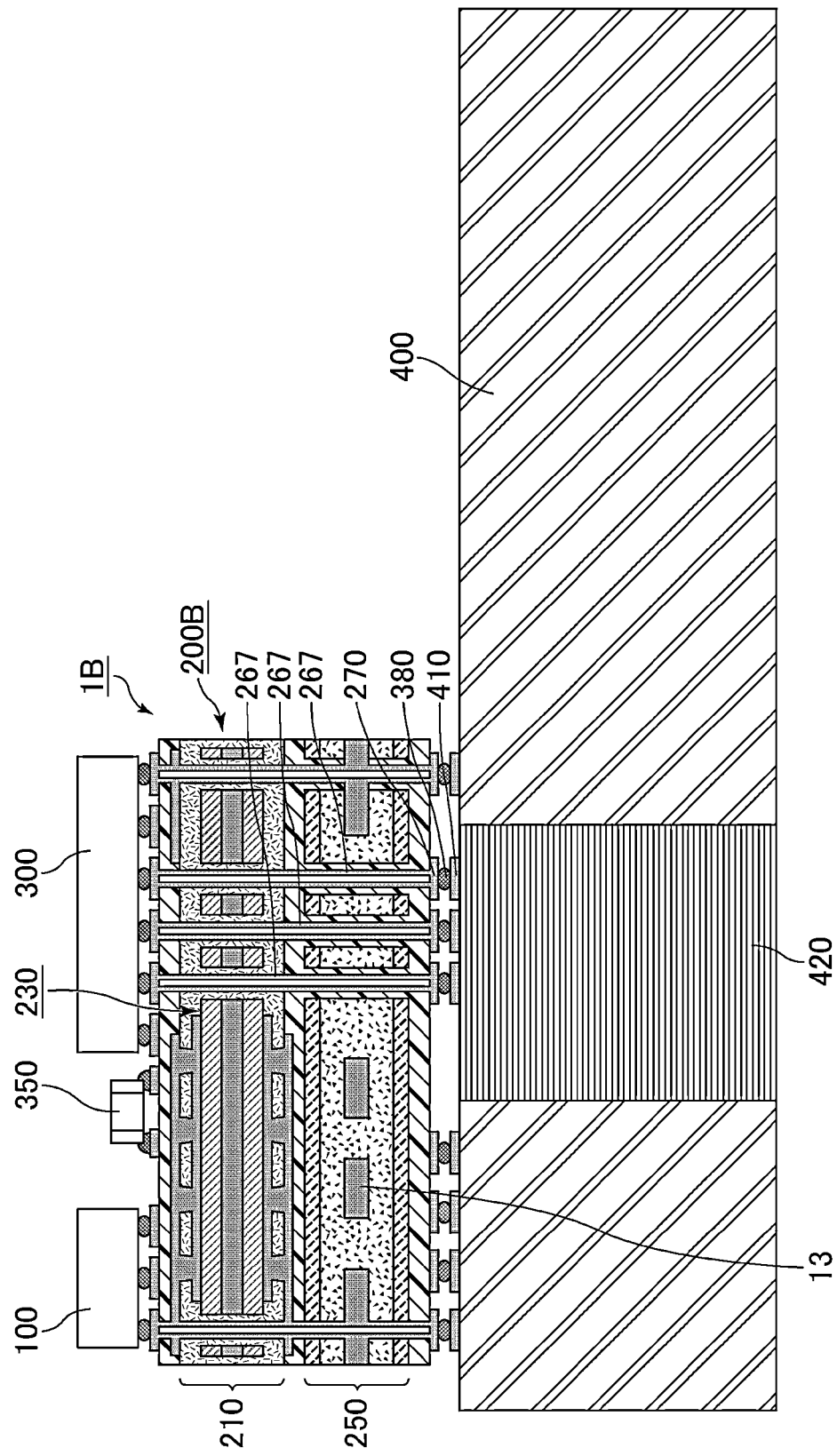
FIG. 9 is a sectional view schematically illustrating another example of a mode in which a semiconductor composite device is mounted on a mother board.

FIG. 9 is a sectional view schematically illustrating another example of a mode in which a semiconductor composite device is mounted on a mother board.

In a package board 200B included in the semiconductor composite device 1B illustrated in FIG. 9, through-hole conductors 267 are provided, which are connected to a load 300 in the case where the load 300 is mounted on the package board 200B.

The through-hole conductors 267 penetrate to the bottom surface terminal layer 270 without being electrically connected to the capacitor part 230 included in the capacitor layer 210 or the inductor wiring 13 included in the inductor layer 250. Further, the through-hole conductors 267 are electrically connected to a terminal 410 connected to a heat sink 420 of the mother board 400, with solder bumps 380 interposed therebetween.

The heat sink 420 is a member that is high in thermal conductivity, such as a copper block. The heat generated by driving the load 300 can be transferred to the heat sink 420 through the through-hole conductors 267.

More specifically, the through-hole conductors 267 are used as heat dissipation paths, and such a configuration can improve allowable power.

Although the three through-hole conductors 267 are provided in FIG. 9, the number of through-hole conductors is not to be considered limited.

Figure 10:
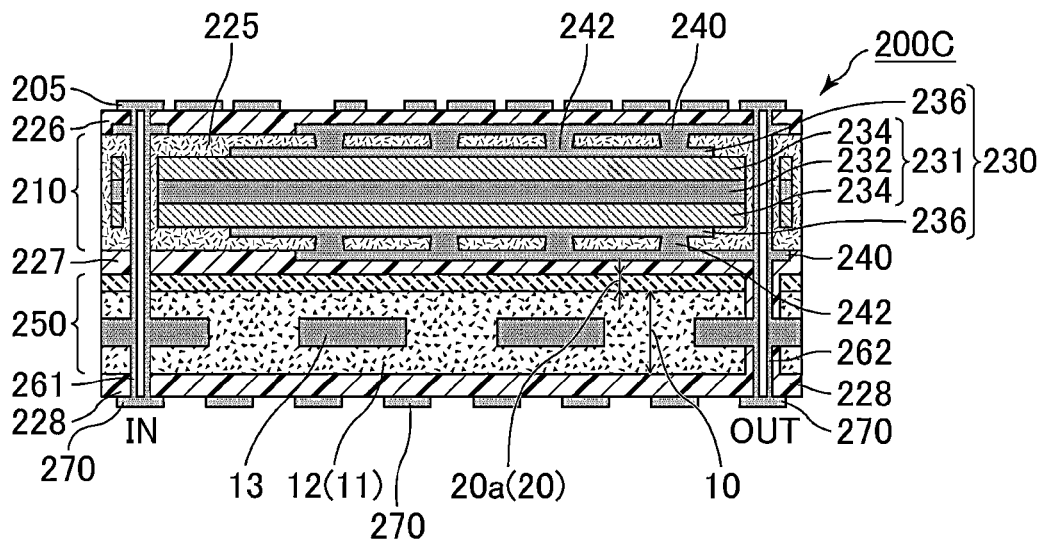
FIG. 10 is a sectional view schematically illustrating another example of a package board.

FIG. 10 is a sectional view schematically illustrating another example of a package board.

In the package board 200C illustrated in FIG. 10, the second magnetic layer 20 is provided only on one surface of the first magnetic layer 10. Specifically, the upper surface-side second magnetic layer 20a on the upper side of the first magnetic layer 10 is provided, whereas the second magnetic layer is not provided on the lower side of the first magnetic layer 10.

Although the upper side and lower side of the first magnetic layer are described in the drawings, the preferred position in the case where the second magnetic layer is provided only on one surface of the first magnetic layer is determined by the relationship with the elements other than the inductor layer. In the case where the second magnetic layer is provided only on one surface of the first magnetic layer, the second magnetic layer is preferably provided between the first magnetic layer and the capacitor layer. In addition, the second magnetic layer is preferably provided between the first magnetic layer and the mounting surface of the package board.

While the radiation noise from the inductor can be suppressed by the second magnetic layer as described above, the effect produced by suppressing the radiation noise is particularly effectively produced in the case where the second magnetic layer is present between the inductor and the capacitor layer or another element.

Figure 11:
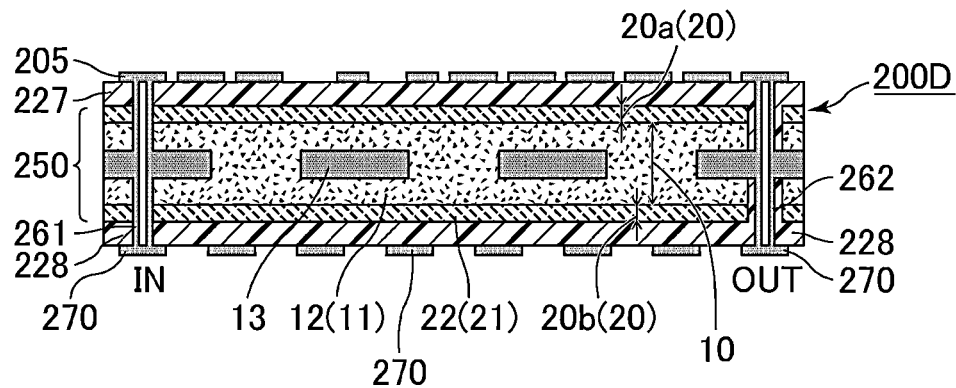
FIG. 11 is a sectional view schematically illustrating another example of a package board.
Figure 12:
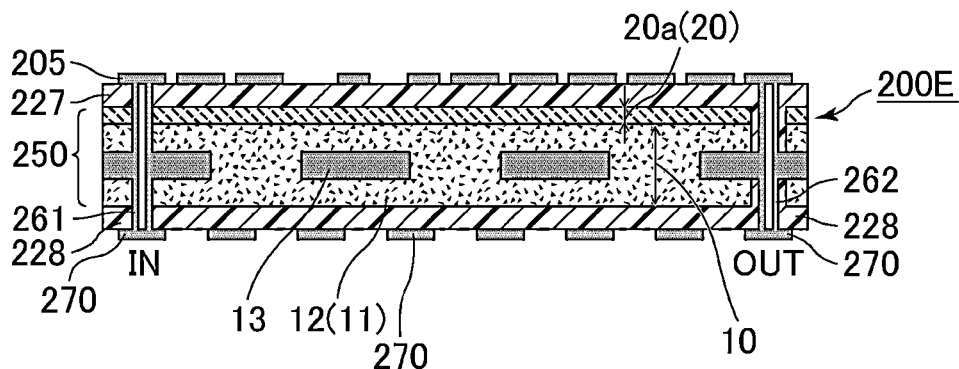
FIG. 12 is a sectional view schematically illustrating another example of a package board.

FIGS. 11 and 12 are sectional views schematically illustrating other examples of package boards.

In the package board 200D illustrated in FIG. 11 and the package board 200E illustrated in FIG. 12, no capacitor layer is provided.

Also in the case where the package board includes no capacitor layer, the inductance can be obtained by the package board including the inductor layer.

In the package board 200D illustrated in FIG. 11, the second magnetic layer 20 is provided on one and the other surfaces of the first magnetic layer 10.

In the package board 200E illustrated in FIG. 12, the second magnetic layer 20 is provided only on one surface of the first magnetic layer 10.

The second magnetic layer is provided, thereby allowing the radiation noise from the inductor to be suppressed.

In the case where the second magnetic layer is provided only on one surface of the first magnetic layer as in the package board 200E illustrated in FIG. 12, the second magnetic layer is preferably provided between the first magnetic layer and the mounting surface of the package board.

[Relationship Between Specifications and Characteristics of Package Board]

The relationship between specifications and characteristics of the inductor layer constituting the package board has been confirmed.

Figure 13:
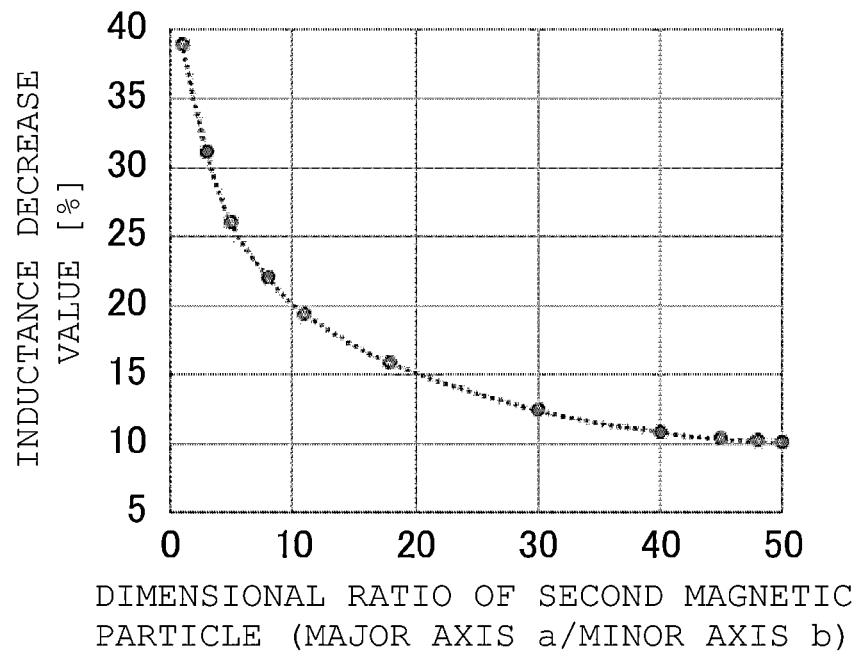
FIG. 13 is a graph showing the relationship between dimensions of a second magnetic particle and an inductance decrease value.

FIG. 13 is a graph showing the relationship between dimensions of the second magnetic particle and an inductance decrease value.

FIG. 13 shows, for the second magnetic particles, the relationship between the dimensional ratio (a/b) where the dimension (diameter) in the X direction shown in FIG. 7 is referred to as the major axis a, whereas the dimension (diameter) in the Z direction shown therein is referred to as the minor axis b, and an inductance decrease value (ratio [%] to the value of the inductance in the absence of any leading wiring) due to the influence of the leading wiring outside the inductor layer. The increased value of the dimensional ratio can be considered meaning higher-flatness particles.

The use of particles that are high in dimensional ratio, that is, particles that are high in flatness results in a high magnetic permeability in the direction along the main surface of the second magnetic layer, suitably producing the effect of confining the magnetic flux within the inductor layer. Being less likely to be affected by the leading wiring of the inductor layer reduces the inductance decrease value.

In addition, the radiation noise from the inductor can be suppressed.

For an inductor, ±20% from a value of standard is often defined as a standard of the inductance. Then, considering that the inductance decrease value can be 20% or less, the dimensional ratio of the second magnetic particles is preferably 10 or more. In the case where the dimensional ratio of the second magnetic particle is 10 or more, the flatness of the second magnetic particle is 0.9 or more.

Next, the relationships between the thickness ratio of the second magnetic layer and first magnetic layer and characteristics will be described.

Figure 14:
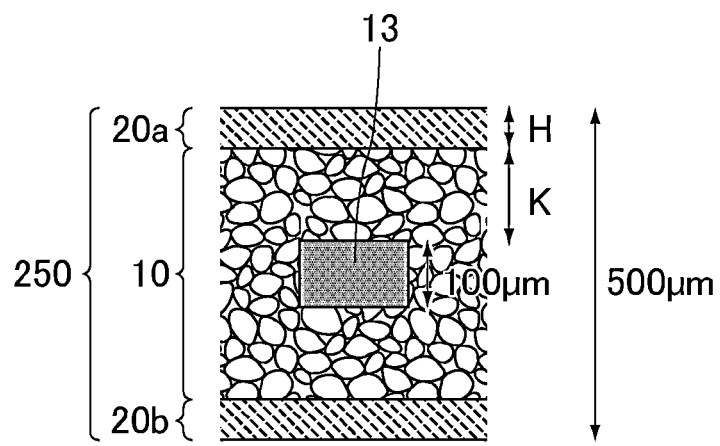
FIG. 14 is a sectional view schematically illustrating dimensions of an inductor layer used in a test.

FIG. 14 is a sectional view schematically illustrating dimensions of an inductor layer used in a test.

FIG. 14 shows that the thickness of the inductor layer 250 is 500 µm, the thickness of the inductor wiring 13 is 100 µm, the thicknesses of the upper surface-side second magnetic layer 20a and lower surface-side second magnetic layer 20b are both H µm (dimension indicated by double-headed arrow H), and the thickness of the first magnetic layer 10 between the inductor wiring 13 and the second magnetic layer 20 is K µm (dimension indicated by double-headed arrow K).

The second magnetic layer used in the test has anisotropy in magnetic permeability, and the magnetic permeability in the direction along the main surface of the second magnetic layer is higher than the permeability in the thickness direction of the second magnetic layer.

In addition, the second magnetic particles included in the second magnetic layer are particles in a shape where a dimension in a direction along the main surface of the second magnetic layer (a direction indicated by a double-headed arrow L in FIG. 6) is longer than a dimension in the thickness direction of the second magnetic layer (a direction indicated by a double-headed arrow T in FIG. 6). Further, the second magnetic particles are particles with a: b=50:1 where the dimension (diameter) in the X direction shown in FIG. 7 is referred to as a major axis a, whereas the dimension (diameter) in the Z direction shown therein is referred to as a minor axis b. The flatness is 0.98.

The magnetic permeability of the second magnetic layer in a direction along the main surface of the second magnetic layer: the magnetic permeability of the first magnetic layer in a direction along the main surface of the first magnetic layer=2:1.

Figure 15:
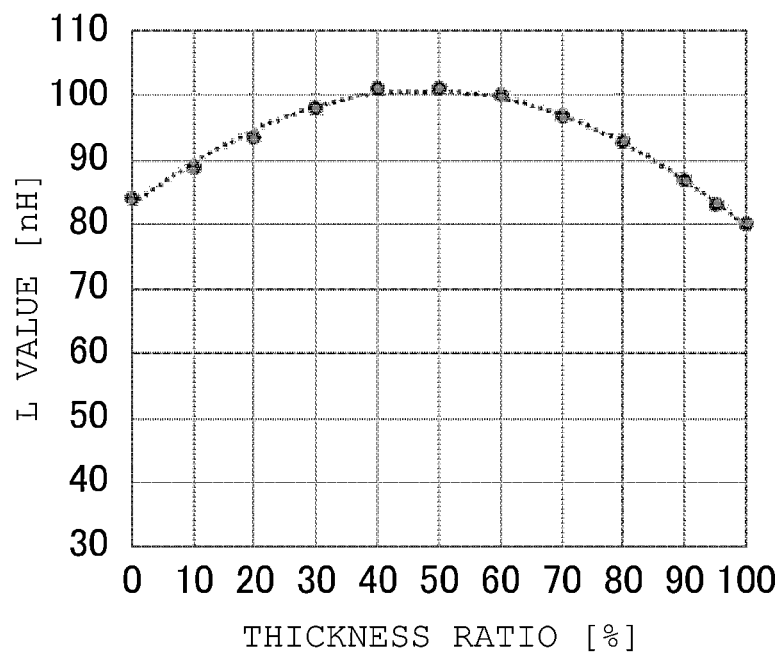
FIG. 15 is a graph showing the relationship between the thickness ratio of a second magnetic layer and a first magnetic layer and the inductance.
Figure 16:
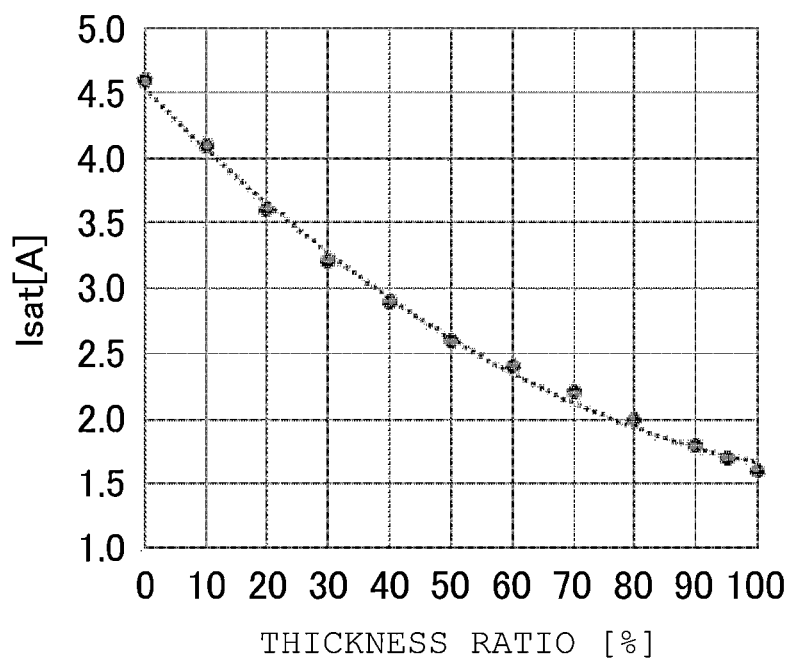
FIG. 16 is a graph showing the relationship between the thickness ratio of the second magnetic layer and first magnetic layer and the superposition characteristics.

In the inductor layer 250 illustrated in FIG. 14, the relationships between the thickness ratio of the second magnetic layer and first magnetic layer and characteristics are shown in FIGS. 15 and 16.

FIG. 15 is a graph showing the relationship between the thickness ratio of the second magnetic layer and first magnetic layer and the inductance.

FIG. 16 is a graph showing the relationship between the thickness ratio of the second magnetic layer and first magnetic layer and the superposition characteristics.

The horizontal axes of FIGS. 15 and 16 indicate a ratio between the dimensions H and K in FIG. 14 as the thickness ratio of the following formula.

Thickness Ratio=$[H/(H+K)] \times 100(\%)$

The graphs of FIGS. 15 and 16 are created by, with H+K=200 µm fixed, calculating the thickness ratio while changing the proportions of H and K.

The vertical axis of FIG. 15 indicates an inductance value (L value [nH]). From FIG. 15, it is determined that the thickness ratio most preferably falls within the range of 40% to 50% from the viewpoint of the inductance value.

The vertical axis of FIG. 16 indicates a direct-current superimposed rated current value (Isat [A]). From FIG. 16, it is determined that the second magnetic layer is preferably thinner from the viewpoint of the superposition characteristics. Accordingly, the second magnetic layer is preferably not excessively thick so as to enhance the superposition characteristics.

Practically, the thickness ratio is preferably 30% or more for sufficiently producing the effect of providing the second magnetic layer.

From this viewpoint, the thickness ratio is preferably 30% to 50%.

What is claimed is:

1. A package board comprising:
 an inductor layer comprising:
  a first magnetic layer comprising a first magnetic particle and a resin;
  an inductor wiring that functions as an inductor in the first magnetic layer; and
  a second magnetic layer on at least one surface of the first magnetic layer, the second magnetic layer comprising a second magnetic particle that is higher in average flatness than the first magnetic particle and a resin, and the second magnetic particle having a shape where a dimension in a direction along a main surface of the second magnetic layer is longer than a dimension in a thickness direction of the second magnetic layer,
 wherein a thickness ratio ([H/(H+K)]×100 (%)) is 30% to 50%, where H is a thickness of the second magnetic layer, and K is a thickness of the first magnetic layer between the inductor wiring and the second magnetic layer.

2. The package board according to claim 1, wherein, when a plane along a main surface of the first magnetic layer is viewed in a thickness direction of the first magnetic layer,
 the inductor wiring is a single wiring where multiple straight lines that differ in current flowing direction are connected, and where a shape of a connection connecting the multiple straight lines is a straight line or a curved line, and
 the current flowing direction in one straight line differs from the current flowing direction in another straight line adjacent to the straight line.

3. The package board according to claim 1, wherein the inductor wiring has an aspect ratio of 0.2 or more, the aspect ratio represented by wiring thickness/wiring width.

4. The package board according to claim 2, wherein a magnetic permeability of the second magnetic layer in a direction along the main surface of the second magnetic layer is higher than a magnetic permeability of the first magnetic layer in a direction along the main surface of the first magnetic layer.

5. The package board according to claim 4, wherein the magnetic permeability of the second magnetic layer in the direction along the main surface of the second magnetic layer is 1.5 times or more as high as the magnetic permeability of the first magnetic layer in the direction along the main surface of the first magnetic layer.

6. The package board according to claim 1, wherein a magnetic permeability of the second magnetic layer in a direction along the main surface of the second magnetic layer is higher than a magnetic permeability of the first magnetic layer in a direction along a main surface of the first magnetic layer.

7. The package board according to claim 6, wherein the magnetic permeability of the second magnetic layer in the direction along the main surface of the second magnetic layer is 1.5 times or more as high as the magnetic permeability of the first magnetic layer in the direction along the main surface of the first magnetic layer.

8. The package board according to claim 1, wherein the second magnetic layer has a magnetic permeability in the direction along the main surface of the second magnetic layer that is higher than a magnetic permeability in the thickness direction of the second magnetic layer.

9. The package board according to claim 8, wherein the magnetic permeability in the direction along the main surface of the second magnetic layer is five times or more as high as the magnetic permeability in the thickness direction of the second magnetic layer.

10. The package board according to claim 1, further comprising a through-hole conductor that penetrates the first magnetic layer and the second magnetic layer in a thickness direction of the package board.

11. The package board according to claim 1, further comprising:
 a capacitor layer with a capacitor therein,
  wherein the second magnetic layer of the inductor layer is between the first magnetic layer of the inductor layer and the capacitor layer.

12. The package board according to claim 1, wherein a filling ratio of the first magnetic particles in the first magnetic layer is 50% or more.

13. The package board according to claim 1, wherein the dimension in the direction along the main surface of the second magnetic layer is 50 μm to 1000 μm.

14. The package board according to claim 13, wherein the dimension in the thickness direction of the second magnetic layer is 0.5 μm to 50 μm.

15. The package board according to claim 1, wherein average flatness of the first magnetic particles is ⅓ or less.

16. The package board according to claim 1, wherein the thickness ratio is 40% to 50%.

* * * * *